(12) United States Patent
Nakura

(10) Patent No.: US 6,455,882 B1
(45) Date of Patent: Sep. 24, 2002

(54) SEMICONDUCTOR DEVICE HAVING A HYDROGEN BARRIER LAYER

(75) Inventor: Takeshi Nakura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/605,385

(22) Filed: Jun. 28, 2000

(30) Foreign Application Priority Data

Jun. 29, 1999 (JP) .............................................. 11-183284

(51) Int. Cl.[7] ....................... H01L 27/108; H01L 29/76; H01L 29/94; H01L 31/119
(52) U.S. Cl. ..................... 257/295; 257/532; 257/306
(58) Field of Search ................................. 257/295–310, 257/530–535; 438/3, 253–254, 396–398

(56) References Cited

U.S. PATENT DOCUMENTS 5,504,041 A * 4/1996 Summerfelt ................ 438/253
5,624,864 A * 4/1997 Arita et al. .................... 438/3
6,249,014 B1 * 6/2001 Bailey ......................... 257/295

FOREIGN PATENT DOCUMENTS

| JP | 7-263637 | | 10/1995 |
| JP | 409097883 A | * | 4/1997 |
| JP | 11-74486 | | 3/1999 |
| JP | 11-111930 | | 4/1999 |

* cited by examiner

*Primary Examiner*—Steven Loke
*Assistant Examiner*—Cuong Quang Nguyen
(74) *Attorney, Agent, or Firm*—Sughrue Mion, PLLC

(57) ABSTRACT

A consolidated LSI including a logic circuit section and a FeRAM section formed on a single chip has a hydrogen barrier layer covering the cell array of the FeRAM section. The hydrogen barrier layer is made of plasma CVD SiON and has an excellent hydrogen barrier function. The hydrogen barrier layer protects the ferroelectric film of a ferroelectric capacitor an against the hydrogen-annealing process in the fabrication a process for the consolidated LSI.

11 Claims, 5 Drawing Sheets

SEMICONDUCTOR DEVICE HAVING A HYDROGEN BARRIER LAYER

BACKGROUND OF THE INVENTION (a) Field of the Invention

The present invention relates to a semiconductor device having a hydrogen barrier layer and, more particularly, to a structure suited for a consolidated LSI including a logic circuit section and a FeRAM section.

(b) Description of the Related Art

Consolidated LSIs having a logic circuit and a nonvolatile memory device integrated on a single chip are known in this art. Conventionally, the nonvolatile memory device is implemented by an EEPROM; however, a FeRAM device having a ferroelectric capacitor in each memory cell is recently used as the nonvolatile memory device due to the superior characteristics thereof such as a higher read/write speed, a lower power dissipation and a larger number of repetitive rewrite operations. The FeRAM device generally includes a FeRAM cell array and a peripheral circuit including a sense amplifier block and a decoder block, and the logic circuit operates for data processing and for conducting read/write operations in association with the peripheral circuit.

In fabrication of MOSFETs which constitute the logic circuit section in the consolidated LSI, a hydrogen-annealing step is conducted to the wafer for several tens of minutes at a temperature of about 400 to 450° C. in a hydrogen ambient containing several percents to fifty percents hydrogen. The hydrogen annealing step is conducted for the purpose of finally adjusting the transistor characteristics such as the interface state of the gate electrode, fixed electric charge, ON-current and threshold of the MOSFET. The hydrogen-annealing step is generally conducted after fabrication of the metallic interconnect structure and before formation of the passivation film.

In the FeRAM section in the consolidated LSI, it is known that the ferroelectric capacitor having a ferroelectric film including a perovskite metal oxide such as PZT or BST is liable to desorption of oxygen from the ferroelectric film in a reducing ambient of the hydrogen-annealing. The desorption of oxygen degrades the capacitor characteristics and thus is undesirable.

It is known that the desorption of oxygen is also incurred by a CVD process for depositing a tungsten film in the interconnect structure or a plasma-enhanced CVD process for depositing a silicon oxide film as an interlayer dielectric film. This is because these CVD steps also generate hydrogen similarly to the hydrogen-annealing step, and therefore provides similar adverse effects to the ferroelectric film.

In view of the above, a nitrogen-annealing step is conducted instead of the hydrogen-annealing in the fabrication process for the consolidated LSI having a FeRAM section and a logic circuit section. The nitrogen-annealing process, however, is inferior to the hydrogen-annealing process in terms of the ability for alleviating the damages of the transistor characteristics.

Another process is also studied wherein the hydrogen-annealing process is conducted to the logic circuit section and the peripheral circuit in the FeRAM section after covering the FeRAM cell array by a hydrogen barrier layer. The term "hydrogen barrier layer" as used herein means a film that does not allow hydrogen to penetrate therethrough, such as a film made of a hydrogen-containing metal or a metallic film having a barrier property against hydrogen.

Known examples of a hydrogen barrier layer include a plasma CVD SiN film deposited by a plasma-enhanced CVD process using $SiH_4$ and $NH_3$ at a temperature of about 400° C., a SiN film deposited by a thermal CVD process, a $TiO_2$ film deposited by sputtering at a temperature of 100° C. to 200° C., and a metal nitride film having an electric conductivity, such as TiN or AlN film, deposited by sputtering at a temperature of 100° C. to 200° C.

The known hydrogen barrier layers have the following problems:

The plasma CVD SiN film has inherently a higher hydrogen content ranging 20 and 25 atomic percents due to residual hydrogen. This incurs a reducing reaction in the ferroelectric film by the residual hydrogen. In addition, the plasma CVD SiN film has a higher permeability for water, and thus the water penetrating through the plasma CVD SiN film and an overlying film degrades the transistor characteristics. Moreover, the plasma CVD SiN film generates a large stress acting on the ferroelectric film ranging between a tensile stress of $2 \times 10^9$ $dyne/cm^2$ and a compressive stress of $5 \times 10^9$ $dyne/cm^2$, which stress degrades the capacitor characteristics due to the degraded characteristics of the ferroelectric film. Furthermore, the plasma CVD SiN film has a poor affinity with respect to an $O_3$-TEOS (tetraethylorthosilicate) $SiO_2$ film.

The thermal CVD process for depositing a SiN film involves a higher temperature for deposition, which provides adverse effects to the ferroelectric film in the capacitor.

The $TiO_2$ film is liable to a reduction reaction due to the hydrogen to change the film property thereof, thereby losing the hydrogen barrier property, although it does not allow ingress of hydrogen, thus has no residual hydrogen therein, has a lower permeability for water and generates a lower stress during the heat treatment.

The conductive metal nitride film, such as TiN or AlN film, has advantages in that it does not allow ingress of hydrogen and thus has no residual hydrogen and a lower permeability for water. However, the conductive metal nitride film generates a larger stress during the heat treatment, and also has limited uses due to the electric conductive property itself. For example, the metal nitride film is not applicable for covering the capacitor as a whole because a short circuit failure may arise due to the electric conductive property.

A ferroelectric film such as PZT or SBT is also proposed for implementing the hydrogen barrier layer. However, upon ingress of hydrogen, the barrier property of the ferroelectric film, wherein the ferroelectric film itself is subjected to reduction by the hydrogen, incurs generation of water which is undesirable.

In short, the conventional hydrogen barrier layers are not satisfactory in fabrication of the consolidated LSI having a FeRAM section and a logic circuit section. This also applies to a LSI having a ferroelectric capacitor including a ferroelectric film or a LSI having a component liable to degradation of characteristics thereof caused by a reduction reaction by hydrogen.

Thus, it has been desired to form a hydrogen barrier layer having a suitable hydrogen barrier property.

SUMMARY OF THE INVENTION

In view of the above, it is an object of the present invention to provide a semiconductor device including a hydrogen barrier layer having an excellent hydrogen barrier property.

It is noticed by the present inventor that a SiON film, especially formed by a plasma CVD process, has an excellent hydrogen barrier property, a lower hydrogen content, and a lower permeability for water, and generates less stress upon ids change of the ambient temperature.

Based on the above findings, the present invention provides a semiconductor device including a substrate, first and second circuit sections having specific functions and disposed separately on the substrate, and a hydrogen barrier layer covering the first circuit section while exposing the second circuit section, the hydrogen barrier layer including SiON.

In accordance with the present invention, the SiON film constituting the hydrogen barrier layer protects the circuit components in the first circuit section during a hydrogen-annealing process for the second circuit section in the fabrication process for the semiconductor device. The damages in the first circuit section due to the hydrogen-annealing process can be effectively prevented by the superior hydrogen barrier property of the SiON film.

The above and other objects, features and advantages of the present invention will be more apparent from the following description, referring to the accompanying drawings.

PREFERRED EMBODIMENT OF THE INVENTION

The semiconductor device according to the preferred embodiment of the present invention has a plasma CVD SiON film covering circuit components in the first circuit section liable to characteristic degradation by the hydrogen-annealing process. Examples for the circuit components include circuit elements such as a capacitor, transistor, resistor etc. as well as parts for the circuit element, such as capacitor film and electrode.

For assuring the advantages of the present invention, samples of the semiconductor device having the plasma CVD SiON film each including an array of 2500 capacitors arranged in a 2×2 $\mu$m square area were fabricated, followed by a hydrogen-annealing step conducted thereto. The structures of these samples are similar to the structure of the embodiment of the present invention as will be described later with reference to FIG. 1 except for the MOSFETs which are not in these samples.

During fabrication of the samples #1 to #4, as shown in following Table 1, the plasma CVD SiON film was formed with a parameter of the flow rate of $N_2O$ being set for each sample as shown in Table 1. The process conditions for the sample #3 corresponds to those in the embodiment of FIG. 1.

These samples #1 to #4 were subjected to measurements for the mechanical stress in the SiON film, hydrogen content in the SiON film, and water resistance thereof. The results of the measurements are shown in Table 1 for these samples. The water resistance was measured by the Pressure Cool Test wherein the sample was disposed in a pressurized steam ambient and the time instant at which the penetration of water was found was measured from the start of the test. The longer time measured in this test means a higher water resistivity.

TABLE 1

| Sample | #1 | #2 | #3 | #4 |
|---|---|---|---|---|
| Flow rate of $N_2O$ | 0 sccm | 200 sccm | 400 sccm | 600 sccm |
| Stress | $7 \times 10^9$ dyne/cm$^2$ | $3 \times 10^9$ dyne/cm$^2$ | $1 \times 10^9$ dyne/cm$^2$ | $0.6 \times 10^9$ dyne/cm$^2$ |
| Hydrogen content | $3.5 \times 10^{22}$ cm$^{-3}$ | $2.4 \times 10^{22}$ cm$^{-3}$ | $1.9 \times 10^{22}$ cm$^{-3}$ | $1.6 \times 10^{22}$ cm$^{-3}$ |
| Water resistance | 700 Hr | 1100 Hr | >2000 Hr | 1800 Hr |

As will be understood from Table 1, the mechanical stress in the SiON film in the samples #3 and #4 is extremely low compared to the conventional hydrogen barrier layer made of plasma CVD SiN, whereas the hydrogen content and the water resistance in the samples #1 to #4 were extremely low compared to the conventional hydrogen barrier layer. The water resistance is the inverse of the permeability for water in the SiON film as will be understood from the definition.

In Table 1, the water resistance of the sample #3 is superior to those of the other samples #1, #2 and #4. This fact means that the SiON film in the sample #3 has a highest density among the SiON film in the samples and thus is considered to have the highest hydrogen barrier property.

Figure 3C:
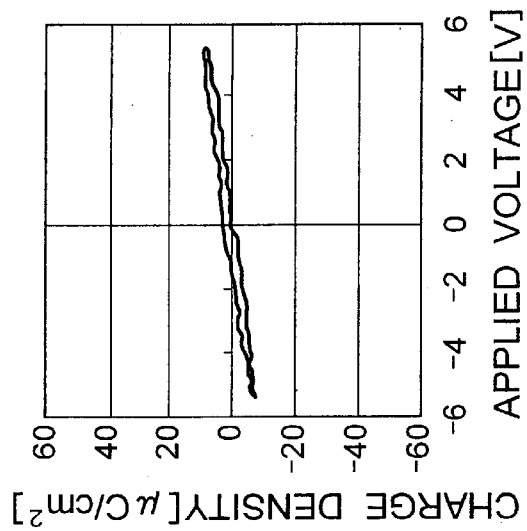
FIGS. 3A to 3C are graphs showing the relationships between the voltage applied to the capacitor and the charge density therein.

The sample #3 was then subjected to measurements of relationship between the applied voltage and the charge density by using a sawyer tower circuit. The results of the measurements are shown in FIG. 3A. Another sample (first comparative example) having a configuration similar to that of the sample #3 except that hydrogen-annealing was not conducted in the another sample was also fabricated and subjected to measurements of the relationship between the applied voltage and the charge density. The results of the measurements are shown in FIG. 3B.

Figure 3B:
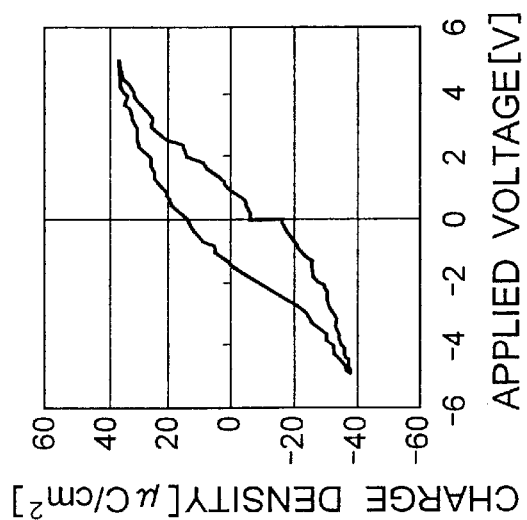
Figure 3A:
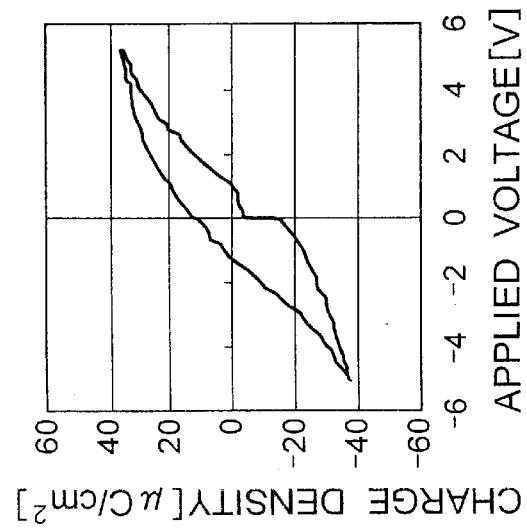

As understood from comparison of FIG. 3A against FIG. 3B, the sample #3 wherein hydrogen-annealing was conducted had a hysteresis curve for the charge density similar to the hysteresis curve for the charge density in the first comparative example wherein hydrogen-annealing was not conducted. This fact shows that the plasma CVD SiON film in the sample #3 had an effective hydrogen barrier property during the hydrogen-annealing step.

A second comparative example was also fabricated which it had a configuration similar to that of the sample #3 except that a plasma CVD SiON film was not provided between interlayer dielectric films (corresponding to dielectric films 30 and 34 in FIG. 1) in the second comparative example. FIG. 3C shows the results of the measurements of the relationship between the applied voltage and the charge density. As understood from FIG. 3C, the hysteresis curve of the charge density showed that the ferroelectric film did not have an effective ferroelectric characteristic.

In a preferred embodiment, the plasma CVD SiON film is interposed between the component and a $O_3$-TEOS $SiO_2$ film. In general, it may cause a problem to deposit the plasma CVD SiON film or the plasma CVD SiN directly on top of the capacitor. This is considered due to the reducing ambient or plasma ambient ensuing from the deposition gas. In consideration of this fact, an $O_3$-TEOS $SiO_2$ film is first deposited on top of the capacitor for prevention of a direct contact between the deposition ambient and the capacitor.

In addition, a $O_3$-TEOS $SiO_2$ film or a plasma-TEOS $SiO_2$ film may be formed on the plasma CVD SiON film. This configuration prevents the possible damages in the plasma CVD SiON film caused by an over-etching during patterning of the interconnect layer. In this respect, if the hydrogen barrier layer is made of plasma CVD SiN as in the conventional device, it is difficult to deposit the $O_3$-TEOS $SiO_2$ film on the plasma CVD SiN film, resulting in degradation of controllability in the etching of the interconnect layer.

In a preferred embodiment of the present invention, the component underlying the plasma CVD SiON film is a ferroelectric capacitor having a metal oxide film as a capacitor insulator film. Preferred examples of the materials for the capacitor insulator film include PZT expressed by chemical formula $PbZr_xTi_{1-x}O_3$, SBT expressed by chemical formula $SrBi_2Ta_2O_9$, and BST expressed by chemical formula $Ba_xSr_{1-x}TiO_3$, but not limited thereto. The underlying capacitor may have electrodes including metal oxide such as $IrO_2$ and $RuO_2$. A part of an element in the PZT or SBT film may be replaced by La, Ca, Sr, Nb etc.

Now, the present invention is more specifically described with reference to accompanying drawings.

Figure 1:
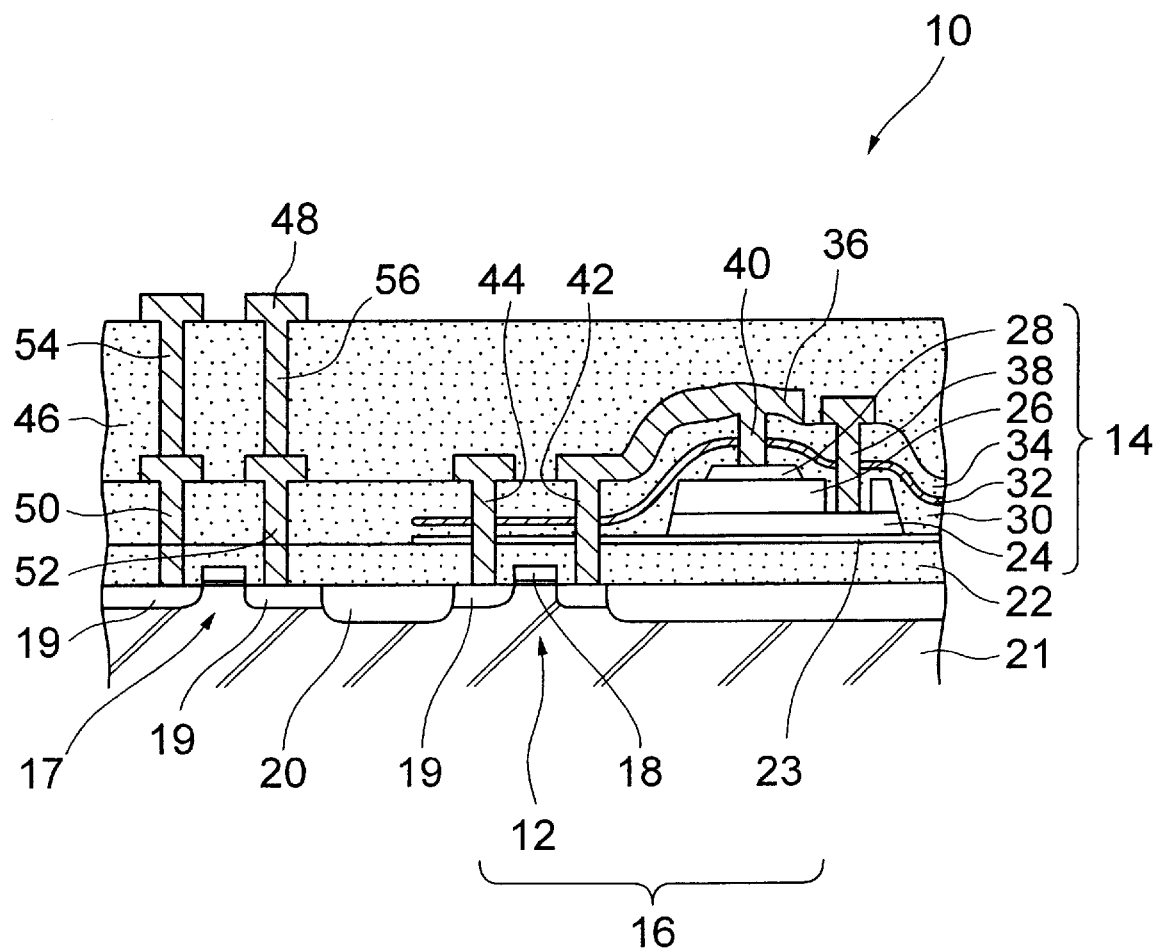
FIG. 1 is a sectional view of a semiconductor device according to an embodiment of the present invention.

Referring to FIG. 1 a consolidated LSI 10 according to an embodiment of the present invention includes a FeRAM section having a plurality of FeRAM memory cells 16 and a logic circuit section having MOSFETs 17. Each memory cell 16 includes a MOSFET 12 and a ferroelectric capacitor 14.

The MOSFET 12 in the memory cell 16 and the MOSFET 17 in the logic circuit have an ordinary configuration including a gate electrode 18 formed on a gate oxide film and a pair of source/drain regions 19. Each MOSFET 12 or 17 is formed on a silicon substrate 21 and isolated from other MOSFETs by an isolation film 20. On the MOSFETs 12 and 17, a first interlayer dielectric film 22 and a plug protective film 23 including a SiON film and a $SiO_2$ film are formed in this order as viewed from the bottom.

The ferroelectric capacitor 14 includes a bottom electrode 24, an insulator film 26 and a top electrode 28 consecutively formed on the plug protective film 23. The bottom electrode 24 has a two-layer structure including a bottom Ti film and a top Pt film, the capacitor insulator film 26 is made of a ferroelectric material, for example PZT, and the top electrode 28 has a two-layer structure including a bottom $IrO_2$ film and a top Ir film.

On top of the MOSFET 12 and the ferroelectric capacitor 14, a second interlayer insulator film 30 made of $O_3$-TEOS $SiO_2$ having a thickness of 1000 to 2000 angstroms, a hydrogen barrier layer 32 made of plasma CVD SiON having a thickness of 200 to 1000 angstroms and a third interlayer dielectric film 34 made of $O_3$-TEOS $SiO_2$ having a thickness of 3000 angstroms or above are consecutively formed.

On the third interlayer dielectric film 34, fist level 10 interconnects 36 having a four-layer structure including TiN/AlSiCu/TiN/Ti films deposited in this order from the bottom. The bottom electrode 24 and the top electrode 28 of the ferroelectric capacitor 14 and the source/drain regions 19 of the MOSFET 12 are connected to the first level interconnects 36 via through-holes 38, 40, 42 and 44.

On top of the MOSFET 17, the 2000-angstrom-thick second interlayer dielectric film 30 made of $O_3$-TEOS $SiO_2$ and the 3000-angstrom thick third interlayer dielectric film 34 made of $O_3$-TEOS $SiO_2$ are formed in this order as viewed from the bottom. That is, the MOSFETs 17 in the logic circuit section are not covered by the hydrogen barrier layer 32, and thus subjected to exposure to hydrogen during a hydrogen-annealing process.

On the first level interconnects 36 disposed for the MOSFETs 12, ferroelectric capacitors 14 and MOSFETs 17, a fourth interlayer dielectric film 46 made of $SiO_2$ is formed by deposition and patterning.

The source/drain regions 19 of the MOSFET 17 are connected to the first-level interconnects 36 via through-holes 50 and 52, and to the second layer interconnects 48 via through-holes 54 and 56.

Now, the fabrication process for the consolidated LSI of FIG. 1 will be described with reference to FIGS. 2A to 2H, which show the FeRAM section of the consolidated LSI of FIG. 1. Description of the process for the logic circuit section will be omitted here because the process is similar to the conventional process.

An element isolation film 20 is formed on a silicon substrate 21 by using a conventional technique, followed by formation of a gate insulator film, a gate electrode 18, and source/drain regions 19. Subsequently, a first interlayer dielectric film 22 is deposited, followed by patterning thereof to form through-holes and deposition of tungsten plugs 42Y and 44Y in the through-holes.

Thereafter, a 2000-angstrom-thick plug protective film 23 is deposited on the first interlayer dielectric film 22, followed by deposition of 300-angstrom-thick Ti film and 2000-angstrom-thick Pt film to form a bottom electrode layer 24. Subsequently, a capacitor insulator film 26 made of PZT having a thickness of 3000 angstroms is deposited by using a sol-gel technique, sputtering technique or CrD technique. Then, a top electrode layer 28 including a 500-angstrom-thick $IrO_2$ film and a 1000-angstrom-thick Ir film is formed by sputtering, thereby obtaining the structure shown in FIG. 2A.

Thereafter, the top electrode layer 28 is subjected to patterning to form a top electrode 28 which exposes a portion of the insulator film 26, followed by patterning the exposed portion of the insulator film 26 and then the bottom electrode film 24 to thereby configure a capacitor 14 which exposes a portion of the plug protective film 23.

Figure 2A:
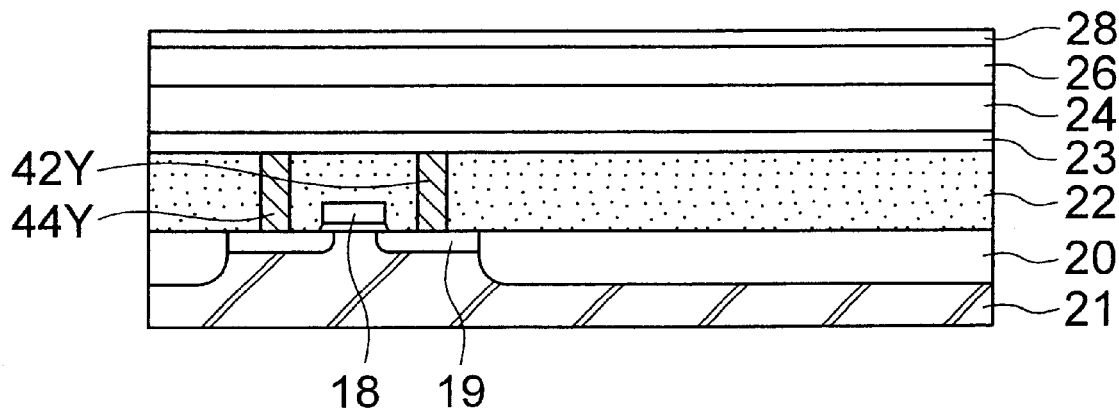
FIGS. 2A to 2H are sectional views of the semiconductor device of FIG. 1 during consecutive steps of fabrication thereof.
Figure 2B:
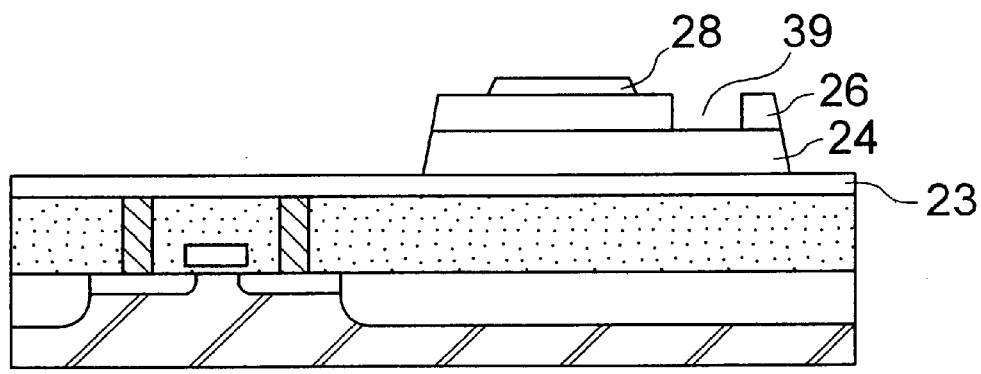

Subsequently, the resultant wafer including the substrate 21 and the capacitor 14 is subjected to annealing in an oxygen ambient at a temperature of 400 to 600° C. for 10 to 25 minutes. This annealing alleviates or cancels the damages incurred in the capacitor insulator film 26 by patterning thereof. Subsequently, the insulator film 26 is etched to form an opening 39 therein, as shown in FIG. 2B. A portion of the plug protective film 23 formed other than the FeRAM cell 16 is removed by etching.

Figure 2C:
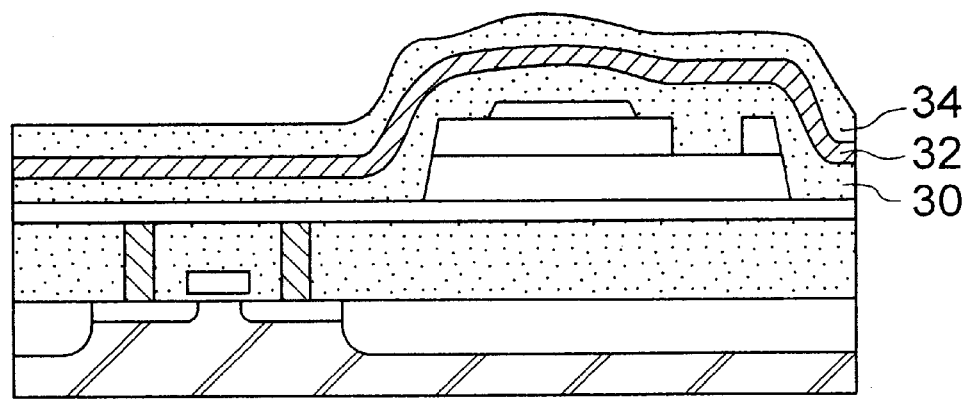

Thereafter, as shown in FIG. 2C, on top of the ferroelectric capacitor 14 and the plug protective film 23, a second interlayer dielectric film 30 made of $O_3$-TEOS $SiO_2$ having a thickness of 1000 to 2000 angstroms is formed, followed by consecutive formation of a hydrogen barrier layer 32 made of plasma CVD SiON having a thickness of 200 to 1000 angstroms and a third interlayer dielectric film 34 made of $O_3$-TEOS $SiO_2$ having a thickness of 3000 angstroms or above. A portion of the hydrogen barrier layer 32 other than in the FeRAM cell 16 is removed by etching.

In the above process, the $O_3$-TEOS $SiO_2$ of the second and third interlayer dielectric films 30 and 34 is formed under the following process conditions:

Gas flow rate: 1.0 sccm for TEOS and 70 g/cm³ for $O_3$
Temperature: 375° C.

The SiNO of the hydrogen barrier layer 32 is formed under the following process conditions:

Gas flow rate: 800 sccm for $SiH_4$, 600 sccm for $NH_3$ and 400 sccm for $N_2$

Temperature: 300° C.

Pressure: 0.3 Torr.

Figure 2D:
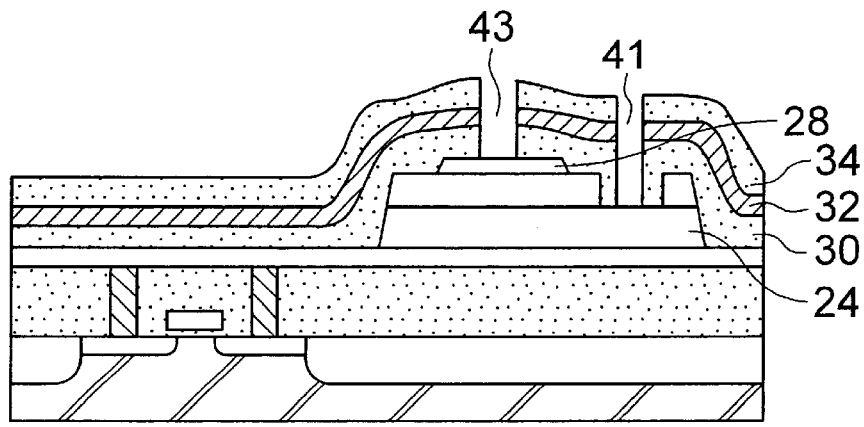

Thereafter, as shown in FIG. 2D, the third interlayer dielectric film 34, the hydrogen barrier layer 32 and the second interlayer dielectric film 30 are etched to form through-holes 41 and 43 for the bottom electrode 24 and the top electrode 28.

The resultant wafer is then subjected to annealing in an oxygen ambient or in a nitrogen ambient at temperature of 400 to 450° C. for 10 to 20 minutes. This annealing is conducted to alleviate the damages incurred in the ferroelectric film by the steps of deposition of the second interlayer dielectric film 30, the hydrogen barrier layer 32 and the third interlayer dielectric film 34 and patterning thereof for forming the through-holes 41 and 43.

Figure 2E:
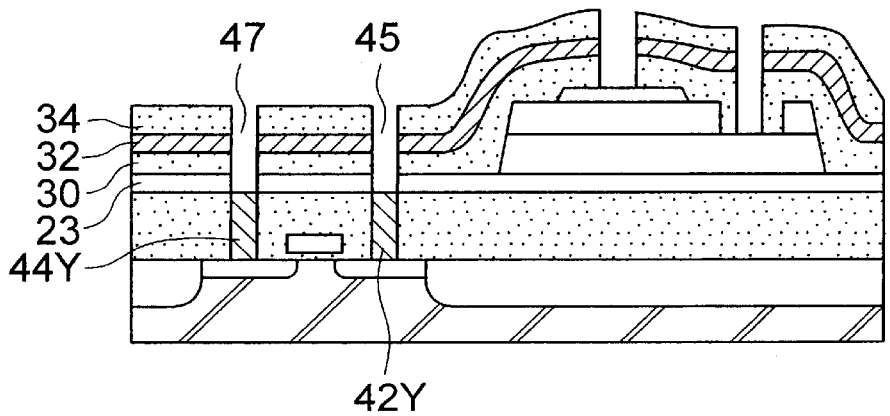

Thereafter, as shown in FIG. 2E, the third interlayer dielectric film 34, the hydrogen barrier layer 32, the second interlayer dielectric film 30 and the plug protective film 23 are etched for patterning to form through-holes 45 and 47 exposing the tops of the contact plugs 42Y and 44Y.

Figure 2F:
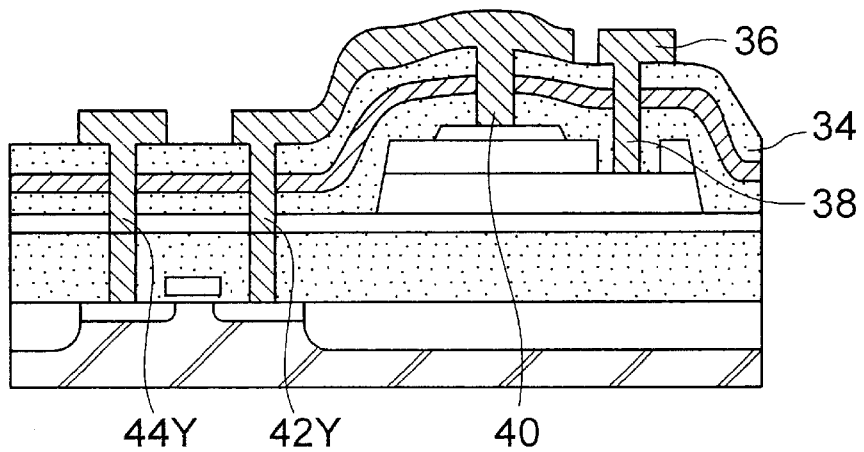

Thereafter, as shown in FIG. 2F, a 7000-angstrom-thick first-level interconnect layer 36 including TiN/AlSiCu/TiN/Ti films is formed on the third interlayer dielectric film 34 and in the through-holes 41, 43, 45 and 47 by sputtering. The first level interconnect layer 36 is then subjected to patterning to form first level interconnects 36 as well as contact plugs 38, 40, 42 and 44.

Figure 2G:
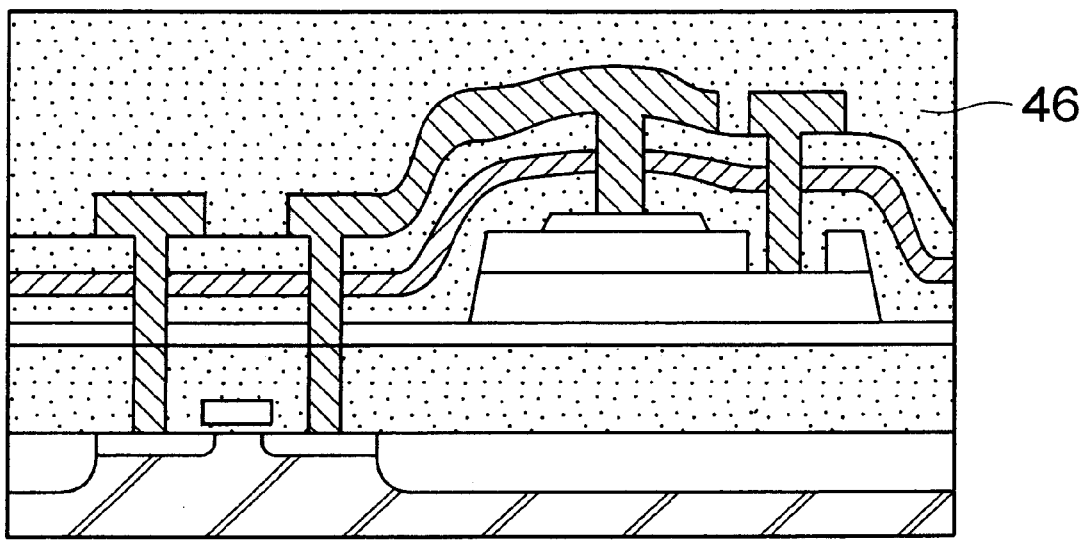

Thereafter, as shown in FIG. 2G, a fourth interlayer dielectric film 46 made of $SiO_2$ is deposited on the first level interconnects 36.

Figure 2H:
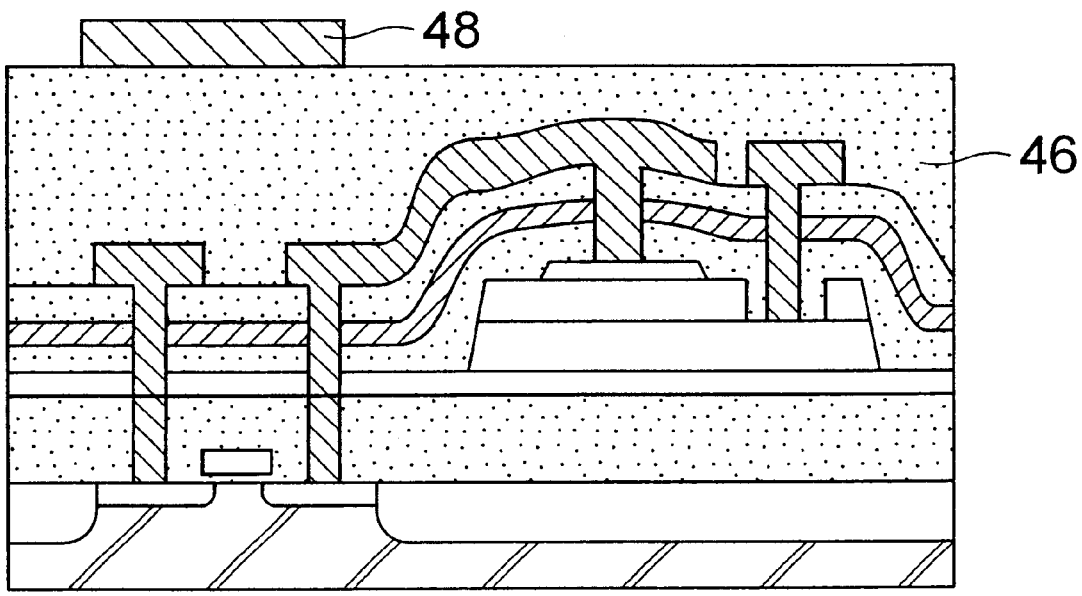

Thereafter, as shown in FIG. 2H, a second level interconnect layer 48 having a configuration similar to the first level interconnect layer 36 is deposited on the fourth interlevel dielectric film 46, followed by patterning thereof to form second level interconnects 48. Then, a $SiO_2$ film not shown in the figure is deposited on the second level interconnects 48.

The wafer shown in FIG. 2H is then subjected to a hydrogen-annealing process for about twenty minutes at a temperature of 400° C. in a gas ambient wherein hydrogen gas and nitrogen gas are mixed at a volumetric ratio of 1:1. The resultant wafer is then subjected to other fabrication steps which are similar to those in the conventional process, thereby obtaining the consolidated semiconductor device of the present embodiment.

The hydrogen barrier layer made of plasma CVD SiON as formed in the consolidated LSI of the present embodiment has a higher barrier property, a lower hydrogen content and a low water permeability, and generates a lower stress during a temperature change.

The $O_3$-TEOS $SiO_2$ films underlying and overlying the plasma CVD SiON film assists formation of the plasma CVD SiON film and protects the plasma CVD SiON film against the damages caused by the following steps.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising a substrate, first and second circuit sections having specific functions and disposed separately on the substrate, and a hydrogen barrier layer covering said first circuit section while exposing said second circuit section, said hydrogen barrier layer including SiON, wherein the first circuit section comprises FeRAM memory cell arrays, each cell including a ferroelectric capacitor and a transistor for selecting the capacitor, and the second circuit section comprises a peripheral circuit including a sense amplifier block, a decoding block, and a logic circuit, wherein said hydrogen barrier insulates an entire area of the memory cell arrays.

2. The semiconductor device as defined in claim 1, wherein said hydrogen barrier layer is a plasma CVD SiON film.

3. The semiconductor device as defined in claim 1, further comprising a $SiO_2$ film interposed between said first circuit section and said hydrogen barrier layer.

4. The semiconductor device as defined in claim 3, wherein said $SiO_2$ film is a plasma CVD film or an $O_3$-TEOS film.

5. The semiconductor device as defined in claim 1, further comprising an $O_3$-TEOS or plasma CVD $SiO_2$ film overlying said hydrogen barrier layer.

6. The semiconductor device as defined in claim 1, wherein said first circuit section includes a capacitor having an insulating film including metal oxide.

7. The semiconductor device as defined in claim 6, wherein said metal oxide includes PZT, SBT, BST or $Ta_2O_5$.

8. The semiconductor device as defined in claim 1, wherein said first circuit section includes a capacitor having an electrode including a conductive metal oxide.

9. The semiconductor device as defined in claim 1, wherein said conductive metal oxide is $IrO_2$ or $RuO_2$.

10. The semiconductor device as defined in claim 1, wherein the SiON of the hydrogen barrier has a mechanical stress of $1 \times 10^9$ dyne/cm$^2$ or less, but greater than zero.

11. The semiconductor device as defined in claim 2, wherein the SiON film has a mechanical stress of $1 \times 10^9$ dyne/cm$^2$ or less, but greater than zero.

* * * * *